(12) United States Patent
Fujioka et al.

(10) Patent No.: US 11,659,697 B2
(45) Date of Patent: May 23, 2023

(54) POWER ELECTRONICS ASSEMBLY HAVING A GATE DRIVE DEVICE DISPOSED BETWEEN A PLURALITY OF TRANSISTORS

(71) Applicant: Toyota Motor Engineering and Manufacturing North America, Inc., Plano, TX (US)

(72) Inventors: Hitoshi Fujioka, Ann Arbor, MI (US); Shailesh N. Joshi, Ann Arbor, MI (US); Feng Zhou, Ann Arbor, MI (US); Danny J. Lohan, Ann Arbor, MI (US)

(73) Assignee: Toyota Motor Engineering and Manufacturing North America, Inc., Plano, TX (US)

( * ) Notice: Subject to any disclaimer, the term of this patent is extended or adjusted under 35 U.S.C. 154(b) by 162 days.

(21) Appl. No.: 17/083,448

(22) Filed: Oct. 29, 2020

(65) Prior Publication Data

US 2022/0141991 A1 May 5, 2022

(51) Int. Cl.
*H01R 25/16* (2006.01)
*H05K 7/20* (2006.01)

(52) U.S. Cl.
CPC ......... *H05K 7/2089* (2013.01); *H01R 25/162* (2013.01)

(58) Field of Classification Search
CPC ............. H01L 21/00; H01L 2224/0603; H01L 2224/37011; H01L 2224/40137; H01L 2224/84801; H01L 2224/32245; H01L 2224/48096; H01L 2224/48137; H01L 2224/48139; H01L 2224/48247; H01L 2224/4903; H01L 2224/73265; H01L 2224/92247; H01L 23/427; H01L 23/473; H01L 23/58; H01L 23/642; H01L 23/04; H01L 23/3107; H01L 23/49541; H01L 24/37; H01L 24/40; H01L 24/84; (Continued)

(56) References Cited

U.S. PATENT DOCUMENTS 6,215,679 B1 * 4/2001 Yamane ................. H05K 9/002
363/39
8,541,875 B2 9/2013 Bennion et al.
(Continued)

FOREIGN PATENT DOCUMENTS

IN  201917027331 A  6/2019
KR    101956997 B1  3/2019

OTHER PUBLICATIONS

Marcinkowski et al., "Dual-sided Cooling for Automotive Inverters—Practical Implementation with Power Module," PCIM Europe, May 19-21, 2015, pp. 1212-1219, Nuremberg, Germany.

*Primary Examiner* — Timothy J Thompson
*Assistant Examiner* — Guillermo J Egoavil
(74) *Attorney, Agent, or Firm* — Jordan IP Law, LLC (57) ABSTRACT

Methods, apparatuses and systems to provide for technology to that includes a plurality of transistors including first transistors and second transistors. The first transistors are disposed opposite the second transistors in a lateral direction with a first space between the first transistors and the second transistors in the lateral direction. A gate driver is electrically connected to the plurality of transistors to operate the plurality of transistors. The gate driver has a first portion disposed between the first transistors and the second transistors in the first space.

20 Claims, 8 Drawing Sheets

(58) Field of Classification Search
CPC . H01L 25/072; H01L 25/115; H01L 27/0664;
H01L 2924/00; H01L 2924/00012; H01L
2924/181; H01R 25/162; H01R 25/16;
H05K 7/2089; H05K 7/20; B60L 1/02;
B60L 15/007; B60L 2240/525; H02M
1/08; H02M 1/327; H02M 7/003; H02M
7/5387; H02M 7/537; H02M 7/53875
USPC .......................................... 361/679; 257/676
See application file for complete search history.

(56) References Cited

U.S. PATENT DOCUMENTS

| | | |
|---|---|---|
| 8,699,254 B2 | 4/2014 | Nishikimi et al. |
| 9,807,913 B2 | 10/2017 | Matsumoto et al. |
| 10,211,193 B2 | 2/2019 | Lee et al. |
| 10,326,378 B2 | 6/2019 | Doo et al. |
| 10,332,822 B2 | 6/2019 | Bradfield |
| 2015/0138734 A1 | 5/2015 | Guo |
| 2017/0033710 A1* | 2/2017 | Muto ................ H01L 23/49541 |
| 2020/0029455 A1 | 1/2020 | Hong et al. |
| 2022/0134889 A1* | 5/2022 | Fujioka ................ H01L 23/642 |
| | | 307/10.1 |

* cited by examiner

POWER ELECTRONICS ASSEMBLY HAVING A GATE DRIVE DEVICE DISPOSED BETWEEN A PLURALITY OF TRANSISTORS

TECHNICAL FIELD

Embodiments generally relate to power electronics assemblies having a reduced size. More particularly, embodiments relate to a power electronics assembly with a gate drive that is disposed between transistors.

BACKGROUND

Semiconductor packages may include numerous electrical components such as power electronic devices (e.g., silicon carbide insulated-gate bipolar transistor or other switching devices) as well as gate drive devices and capacitors. Such semiconductor packages may be used in a variety of contexts, such as the transportation industry (e.g., automotive applications). In the semiconductor packages, the power electronic devices may be separate from the gate drive devices and capacitors. The relative placement and shapes of the power electronic devices, the gate drive devices and capacitors may have impactful effects on performance (e.g., cause parasitic inductance) and size.

BRIEF SUMMARY

In some embodiments an electronics apparatus includes a plurality of transistors including first transistors and second transistors. The first transistors are disposed opposite the second transistors in a lateral direction with a first space between the first transistors and the second transistors in the lateral direction. The apparatus further includes a gate driver (e.g., a gate drive device) electrically connected to the plurality of transistors to operate the plurality of transistors. The gate driver has a first portion disposed between the first transistors and the second transistors in the first space.

In some embodiments, a vehicle includes an electric motor drive, a battery to supply a current to the electric motor drive, and a traction inverter package to modify the current of the battery and provide the modified current to the electric motor drive. The traction inverter package a plurality of transistors including first transistors and second transistors, the first transistors being disposed opposite the second transistors in a lateral direction with a first space between the first transistors and the second transistors in the lateral direction, and a gate driver electrically connected to the plurality of transistors to operate the plurality of transistors, the gate driver having a first portion disposed between the first transistors and the second transistors in the first space.

BRIEF DESCRIPTION OF THE SEVERAL VIEWS OF THE DRAWINGS

The various advantages of the embodiments of the instant disclosure will become apparent to one skilled in the art by reading the following specification and appended claims, and by referencing the following drawings, in which:

DETAILED DESCRIPTION

Figure 1A:
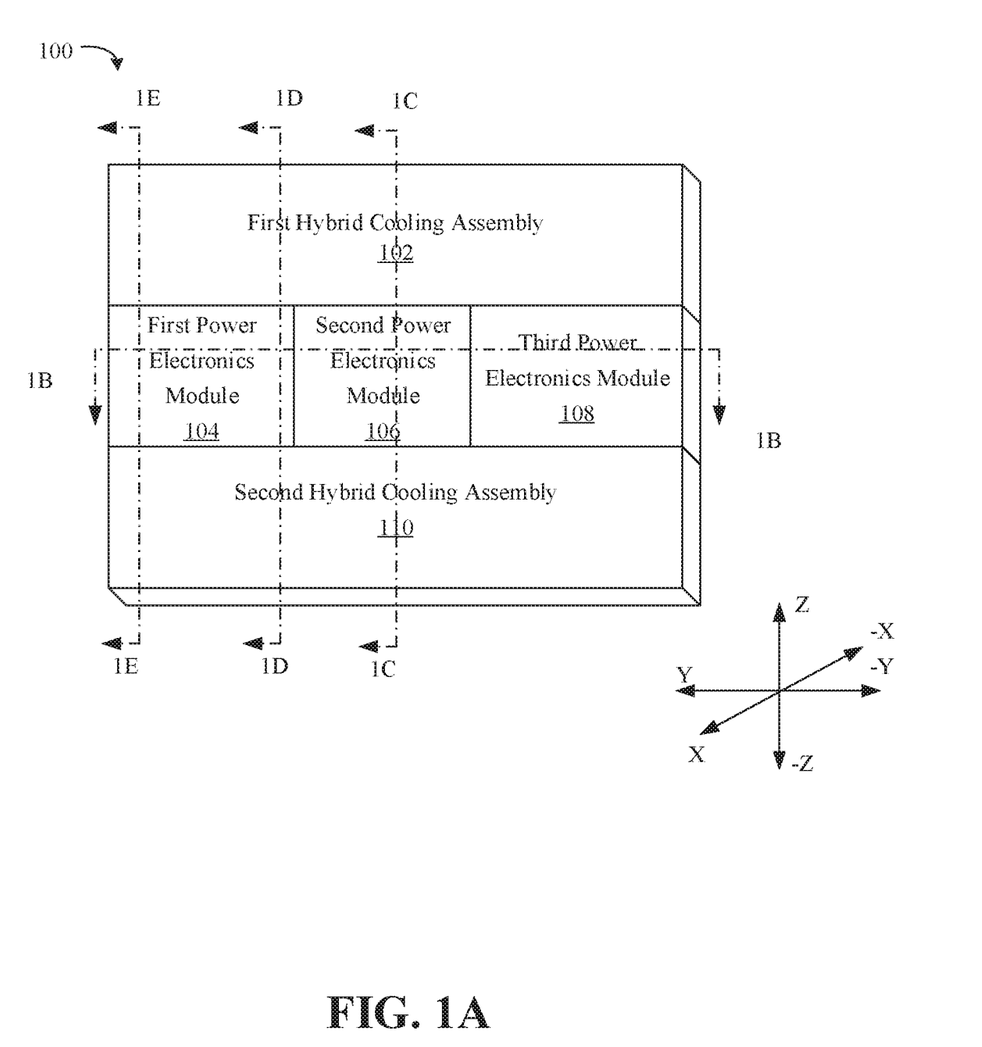
FIG. 1A is a diagram of an example of a power electronics assembly according to an embodiment.

Turning now to FIG. 1A, a power electronics assembly 100 (e.g., an electronics apparatus) is illustrated. The power electronics assembly 100 includes a series of components stacked on each other in a vertical direction (e.g., along the Z-axis). The stacked components may include a first hybrid cooling assembly 102, a first power electronics module 104, a second power electronics module 106, a third power electronics module 108 and a second hybrid cooling assembly 110. As will be discussed in detail, the arrangement of electronics of the first-third power electronics modules 104, 106, 108 and the first and second hybrid cooling assemblies 102, 110 may reduce deleterious effects including parasitic inductance, while also reducing the overall size of the power electronics assembly 100. For example, the placement and shape of transistors, gate drive devices and capacitors may permit a reduction in size of the power electronics assembly 100, while also reducing unwanted thermal effects (e.g., high heat concentrations) and electrical effects (e.g., parasitic induction) caused by spacing from switching elements.

Furthermore, the placement of the first hybrid cooling assembly 102 and the second hybrid cooling assembly 110 permits enhanced cooling as will be discussed below. For example, in some embodiments, each of first and second hybrid cooling assemblies 102, 110 includes a two-phase cooling structure which aligns with and cools one or more high heat flux devices (e.g., transistors). Further, each of first and second hybrid cooling assembly 102, 110 may include a single-phase cooling structure which aligns with and cools one or more low heat flux devices such as capacitors and/or gate drive devices.

Figure 1B:
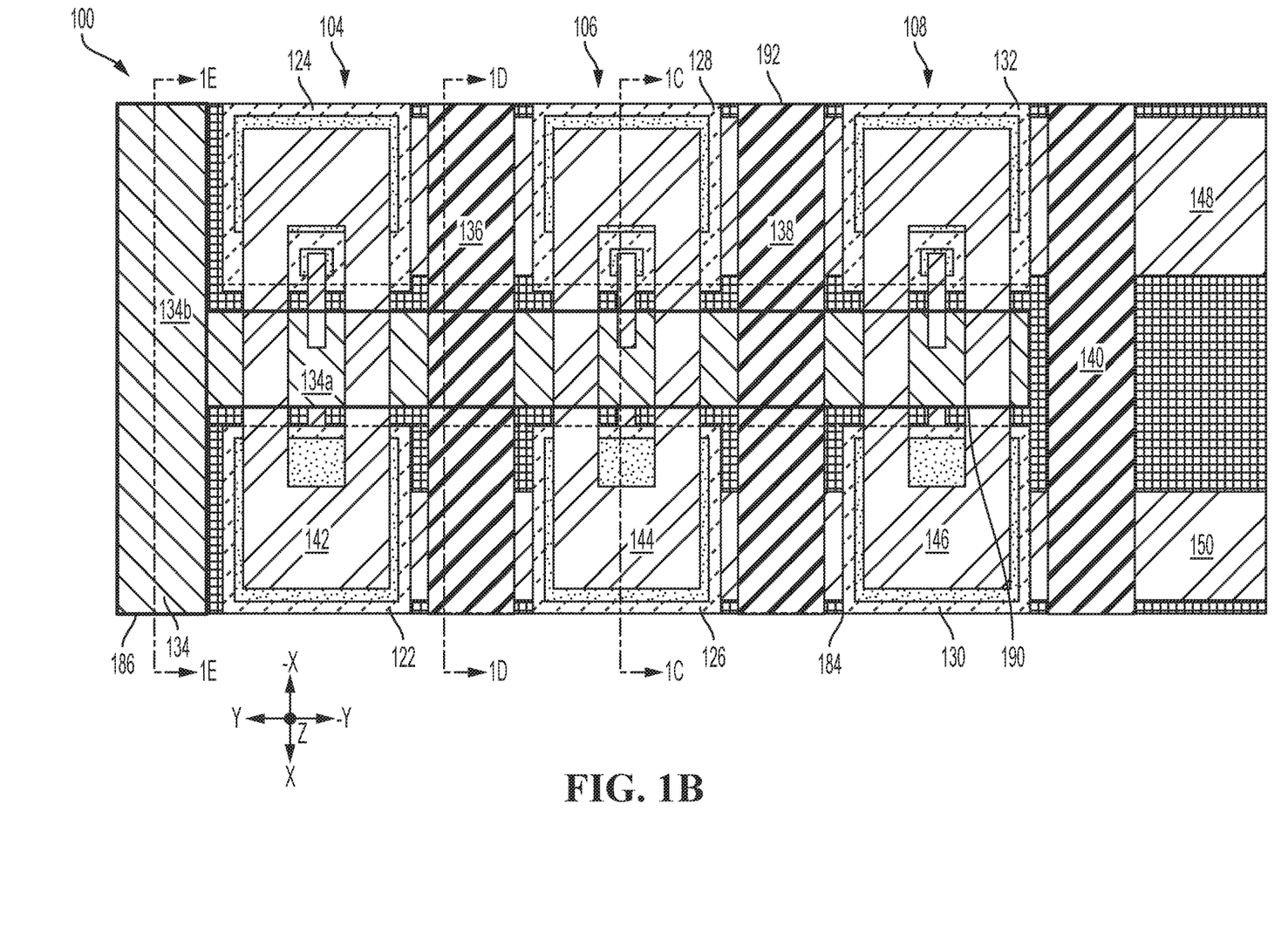
FIG. 1B is a diagram of an example of a top-down view of the power electronics assembly according to an embodiment.

FIG. 1B is a more detailed top-down view (e.g., cross-sectional view) of the power electronics assembly 100 as shown along section or plane 1B-1B of FIG. 1A. As illustrated, a plurality of transistors 122, 124, 126, 128, 130, 132 are paired together. For example, transistors 124, 128, 132 may be referred to as first transistors. Transistors 122, 126, 130 may be referred to as second transistors. Each of respective first transistor of the first transistors 124, 128, 132 may form a pair with one of the second transistors 122, 126, 130 disposed directly across or opposite (e.g., in a lateral direction along the X-direction) from a respective one of the first transistors 124, 128, 132. For example, the first transistor 124 and the second transistor 122 may form a first pair, the first transistor 128 and the second transistor 126 may form a second pair and the first transistor 132 and the second transistor 130 may form a third pair.

A substantially T-shaped gate drive device 134 is electrically connected to the plurality of transistors 122, 124, 126, 128, 130, 132 to operate the plurality of transistors 122, 124, 126, 128, 130, 132. The gate drive device 134 has a first portion 134a extending through a first area 190 (e.g., a central portion or space) between the first transistors 124, 128, 132 and the second transistors 122, 126, 130. For example, the first transistors 124, 128, 132 are disposed opposite the second transistors 122, 126, 130 in a lateral direction (e.g., along the X-axis) of the power electronics assembly 100 with the first area 190 between the first transistors 124, 128, 132 and the second transistors 122, 126, 130 in the lateral direction. The gate drive device 134 (which may also be referred to as a gate driver) is electrically connected to the plurality of transistors 122, 124, 126, 128, 130, 132 to operate the plurality of transistors 122, 124, 126, 128, 130, 132. The gate drive device 134 has a first portion 134a disposed between the first transistors 124, 128, 132 and the second transistors 122, 126, 130 in the first area 190.

In the top-down view of FIG. 1B (e.g., a downward view), the first portion 134a extends between the first transistors 124, 128, 132 and the second transistors 122, 126, 130 in a first direction along the Y-axis. A greatest dimension of the first portion 134a may be in the first direction. A second portion 134b of the gate drive device 134 has a greatest dimension along the X-axis, and in a direction perpendicular or substantially perpendicular to the first direction. Furthermore, the second portion 134b is not disposed between the first transistors 124, 128, 132 and the second transistors 122, 126, 130, but is disposed in a second area 186 outside of the first area 190. As is self-evident, a longitudinal axis of the first portion 134a is perpendicular to a longitudinal axis of the second portion 134b.

The gate drive device 134 may be a power amplifier that receives at least one control signal. The gate drive device 134 may modify the at least one control signal (e.g., increase a magnitude of current and/or voltage), and provide the modified signal control the plurality of transistors 122, 124, 126, 128, 130, 132. In some embodiments, the gate drive device 134 may control individual gate signals supplied to the plurality of transistors 122, 124, 126, 128, 130, 132 so that the transistors 122, 124, 126, 128, 130, 132 operate differently from each other. For example, the first transistor 124 may conduct an electric signal (e.g., placed in an ON state) while the second transistor 122 may not conduct an electric signal (e.g., placed in an OFF state).

As illustrated, each of the each of the first transistors 124, 128, 132 are disposed in a first row on a first lateral side 192 of the power electronics assembly 100, and each of the second transistors 122, 126, 130 are disposed in a second row on a second lateral side 184 of the power electronics assembly 100. The first and second lateral sides 192, 184 are opposite to each other. Further, the first area 190 (e.g., a central area) is between the first and second lateral sides 192, 184. A longitudinal axis of the first portion 134a may be parallel to the first and second rows.

The capacitors 136, 138, 140 may be DC bus capacitors that smooth the DC bus voltage. For example, the capacitor 136 may electrically connect to at least the first transistor 124 and at least the second transistor 122. The capacitor 136 may include a first portion disposed between the first transistors 124, 128, and a second portion disposed between the second transistors 122, 126. The capacitor 136 also includes a third portion connecting the first and second portions that extends over the first portion 134a of the gate drive device. The other capacitors 138, 140 may be similarly formed, and connect to the first transistors 128, 132 and the second transistors 126, 130. Busbars 148, 150 may also electrically connect to the plurality of transistors 122, 124, 126, 128, 130, 132. Furthermore, aperture enhanced (e.g., U-shaped) busbars 142, 144, 146 (e.g., output busbars) may electrically connect to each of the to the plurality of transistors 122, 124, 126, 128, 130, 132. For example, the aperture enhanced busbar 144 may include a hollowed portion (e.g., a hollow center portion) within which a solder 162 (e.g., electrical conductor) connects the first portion 134a of the gate drive device 134 to the second transistor 126.

In some embodiments, busbar 150 may be one single busbar that connects top sides of the second transistors 122, 126, 130. In some embodiments, such as in FIG. 1B, the second transistors 122, 126, 130 may be flip chipped, which means that top sides of the second transistors 122, 126, 130 are bonded to the busbar 150 and face downward in the negative Z direction. Busbar 150 may be an N busbar.

The busbar 148 may be bonded to bottom sides of the first transistors 124, 128, 132. Thus, in some embodiments the first transistors 124, 128, 132 may not be flip chipped such that top sides of the first transistors 124, 128, 132 face upward in the positive Z direction. In some embodiments, busbar 148 may be a P busbar. Busbars 142, 144, 146 may electrically connect top sides of the first transistors 124, 128, 132 to the bottom sides of the second transistors 122, 126, 130. Busbars 142, 144, 146 may be O-busbars corresponding to the three phases of an AC circuit as illustrated in FIG. 1F. Thus, the three busbars 142, 144, 146 may represent the three phase U, V, W, respectively.

Figure 1C:
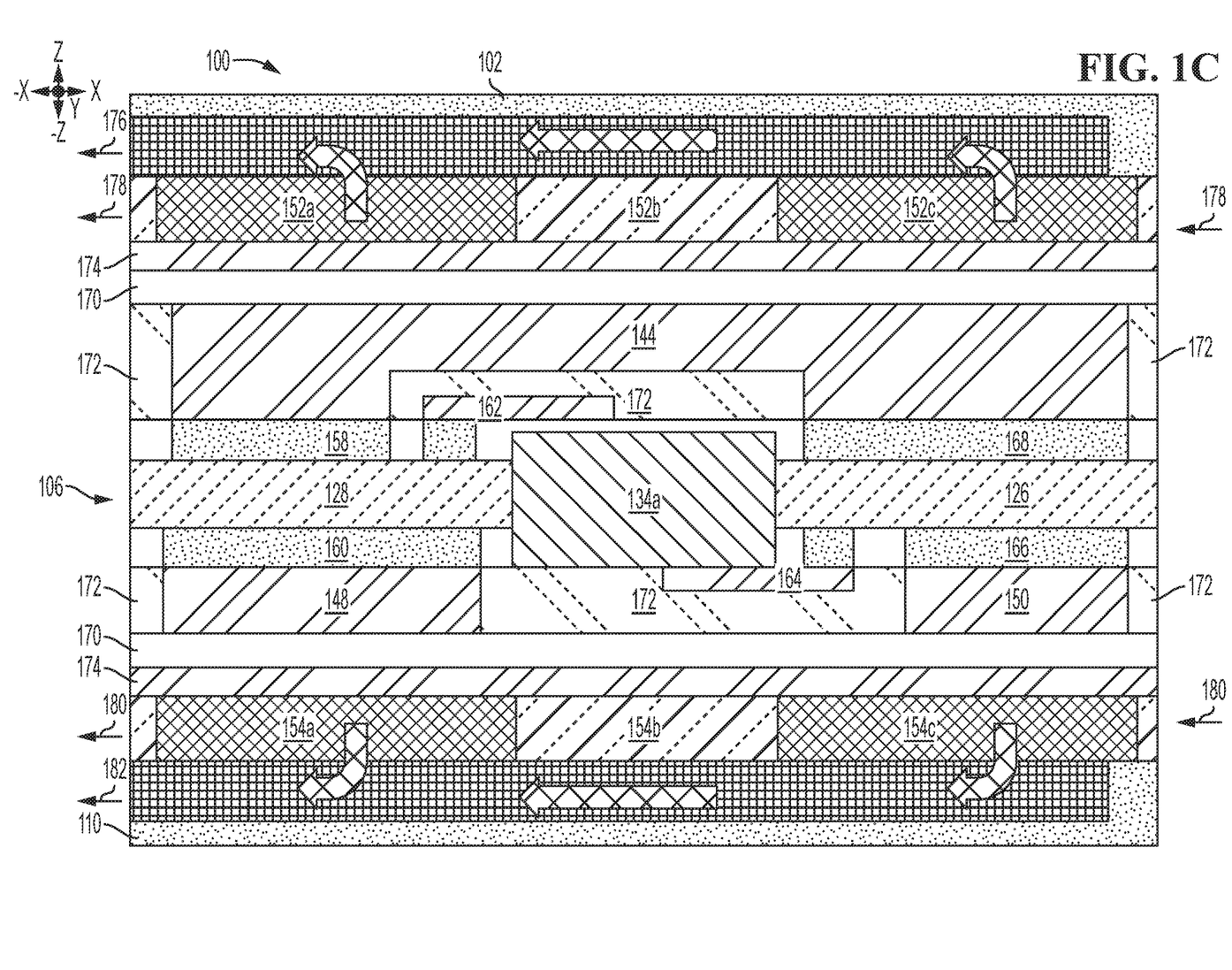
FIG. 1C is a diagram of an example of a side-view of a second power electronics module of the power electronics assembly according to an embodiment.

FIG. 1C illustrates a cross-sectional view (e.g., a side view) along line 1C-1C of FIGS. 1A and 1B. As illustrated, the first portion 134a of the gate drive device 134 is disposed between the first transistor 128 and the second transistor 126. Solder 160 electrically connects the first transistor 128 to the busbar 148 (e.g., a P-busbar). Solder 158 connects the first transistor 128 to a U-shaped busbar 144 (e.g., an output busbar). Solder 162 connects the first portion 134a of the gate drive device 134 to the first transistor 128.

Solder 166 electrically connects the second transistor 126 to the busbar 150 (e.g., a N-busbar). Solder 168 connects the second transistor 126 to the busbar 144 (e.g., the output busbar that outputs electrical power and/or signals). Solder 164 connects the first portion 134a of the gate drive device 134 to the second transistor 126.

In some embodiments, the aperture of the busbar 144 permits the placement of the first portion 134a of the gate drive device 134 at a central location with sufficient clearance to avoid unwanted electrical effects. Thus, a more compact design may be achieved. Mold resin 172 may also insulate electrical components from each other, such as the first portion 134a from the busbar 144.

The first hybrid cooling assembly 102 (e.g., a cooling device) is disposed above the second power electronics module 106. Two-phase cooling portions 152a, 152c align with (e.g., directly above) to cool the first transistor 128 and the second transistor 126 respectively. At the two-phase cooling portions 152a, 152c, coolant may move through metal inverse opals (MIO) or porous metal structure by capillary flow. Heat from the second transistor 126 may cause the coolant 178 to change from liquid to vapor (as represented by the upward-horizontal arrows), hence resulting in two-phase cooling.

Compared to single-phase cooling, two-phase cooling may achieve greater heat transfer away from electronic components. Thus, the two-phase cooling portion 152a, 152c may apply to high heat flux devices (cool the high heat flux devices). Further, the first hybrid cooling assembly 102 may include a single-phase cooling portion 152b to cool low heat flux devices (e.g., capacitors and gate drivers), such as the first portion 134a of the gate drive device 134. As illustrated, the second transistor 126 is sandwiched between the two-phase cooling portion 152a of the first hybrid cooling assembly 102, and a two-phase cooling portion 154a of the second hybrid cooling assembly 110. The first transistor 128 is sandwiched between the two-phase cooling portion 152c of the first hybrid cooling assembly 102, and a two-phase cooling portion 154c of the second hybrid cooling assembly 110. The first portion 134a may be sandwiched between the single-phase cooling portions 152b, 154b.

Cooling fluid flows along the X-axis in the two-phase cooling portions 152a, 152c, 154a, 154c and single-phase cooling portion 152b, 154b (e.g., hybrid two-phase cooling), to cool the electronic components therebetween. Vapor 176, 182 and coolant 178, 180 (e.g., liquid) may circulate through the first and second hybrid cooling assemblies 102, 110. Copper 174 and insulator 170 may also be a part of the power electronics assembly 100.

Figure 1D:
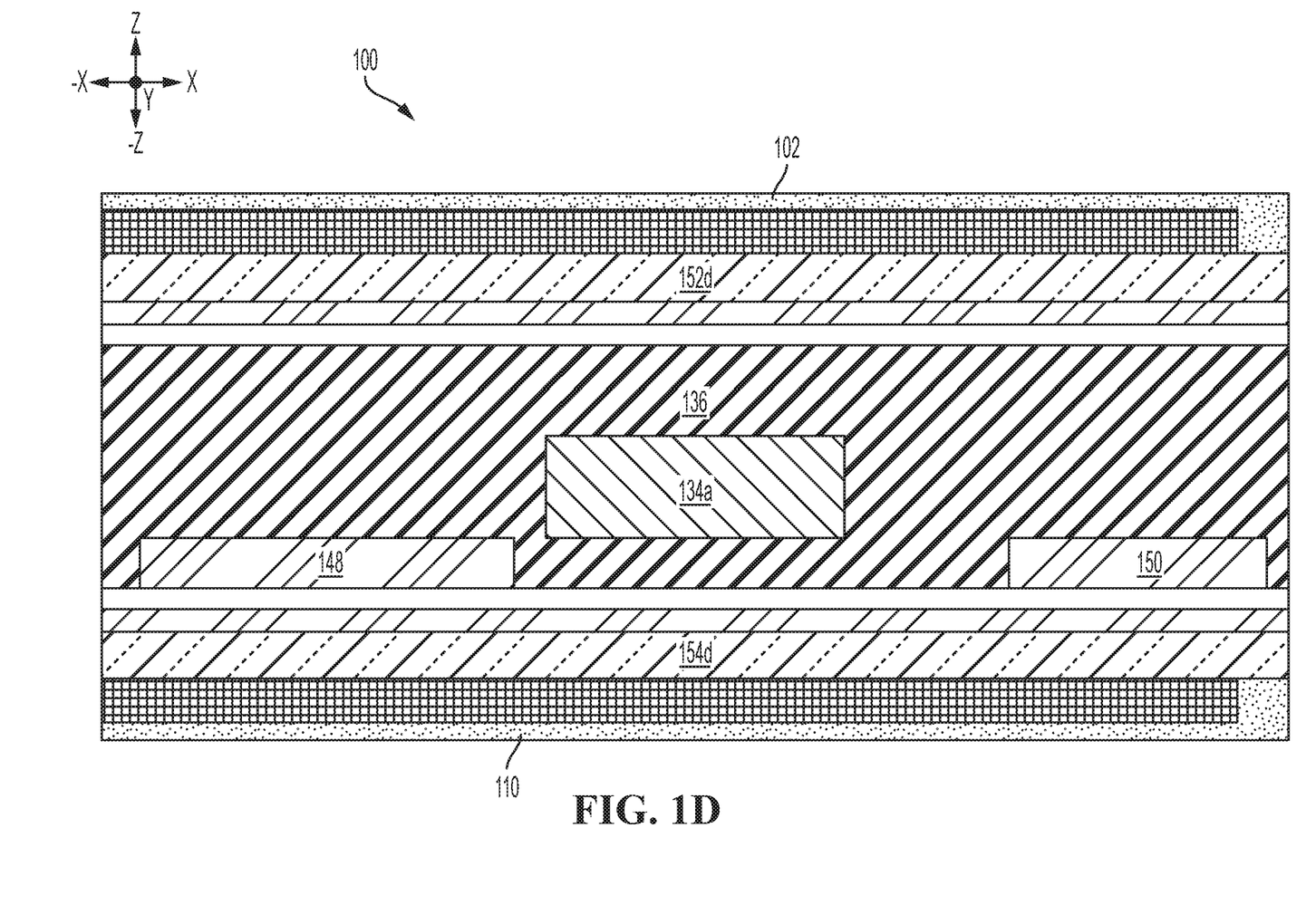
FIG. 1D is a diagram of an example of a side-view of a first power electronics module of the power electronics assembly according to an embodiment.

FIG. 1D illustrates a cross-sectional view along line 1D-1D of FIGS. 1A and 1B. The capacitor 136 may enclose the first portion 134a of the gate drive device 134. Single phase cooling portion 152d of the first hybrid cooling assembly 102 and the single phase cooling portion 154d of the second hybrid cooling assembly 110 may cool the capacitor 136 and first portion 134a.

Figure 1E:
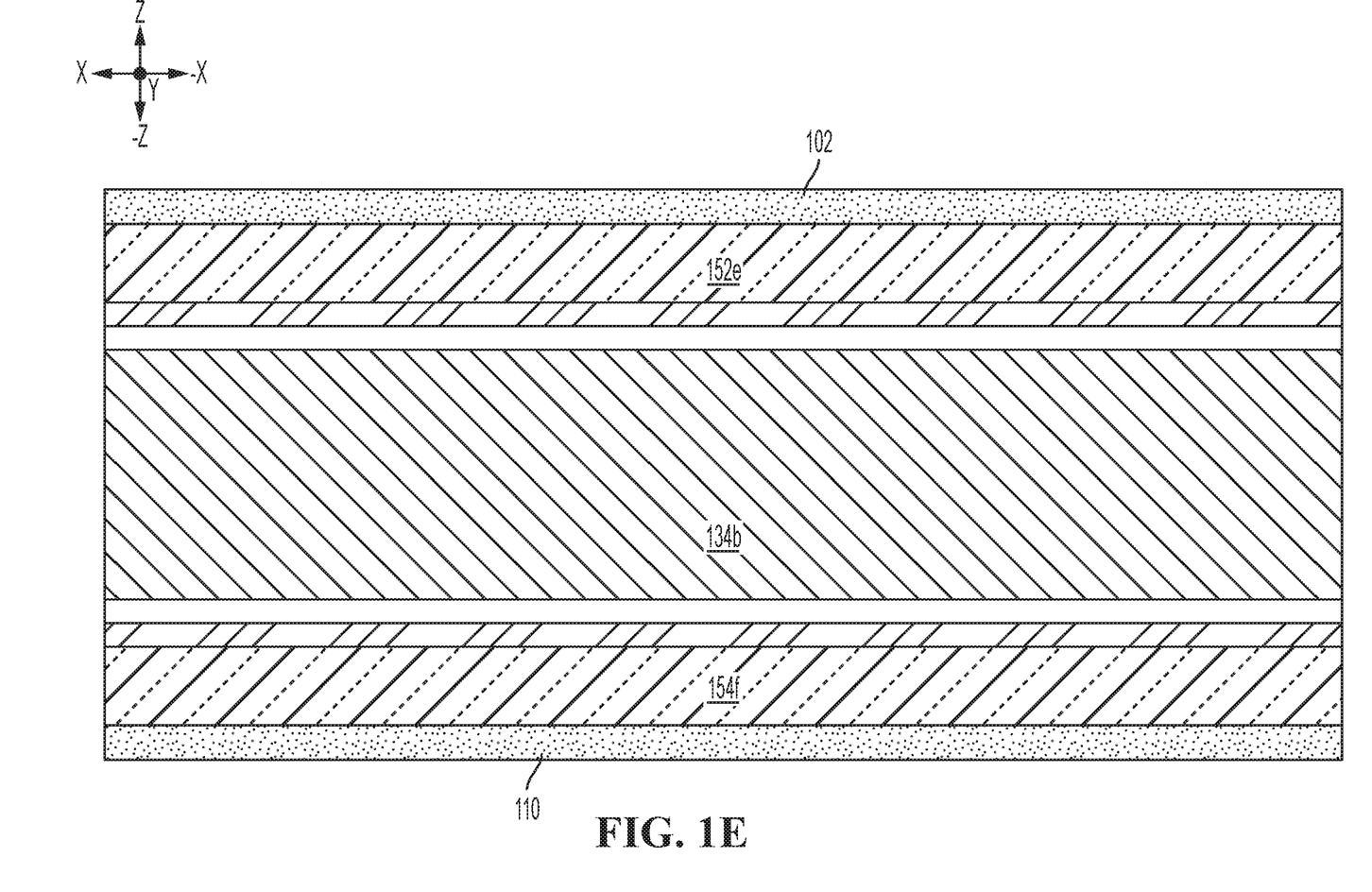
FIG. 1E is a diagram of an example of a side-view of a gate drive device of the power electronics assembly according to an embodiment.
Figure 1F:
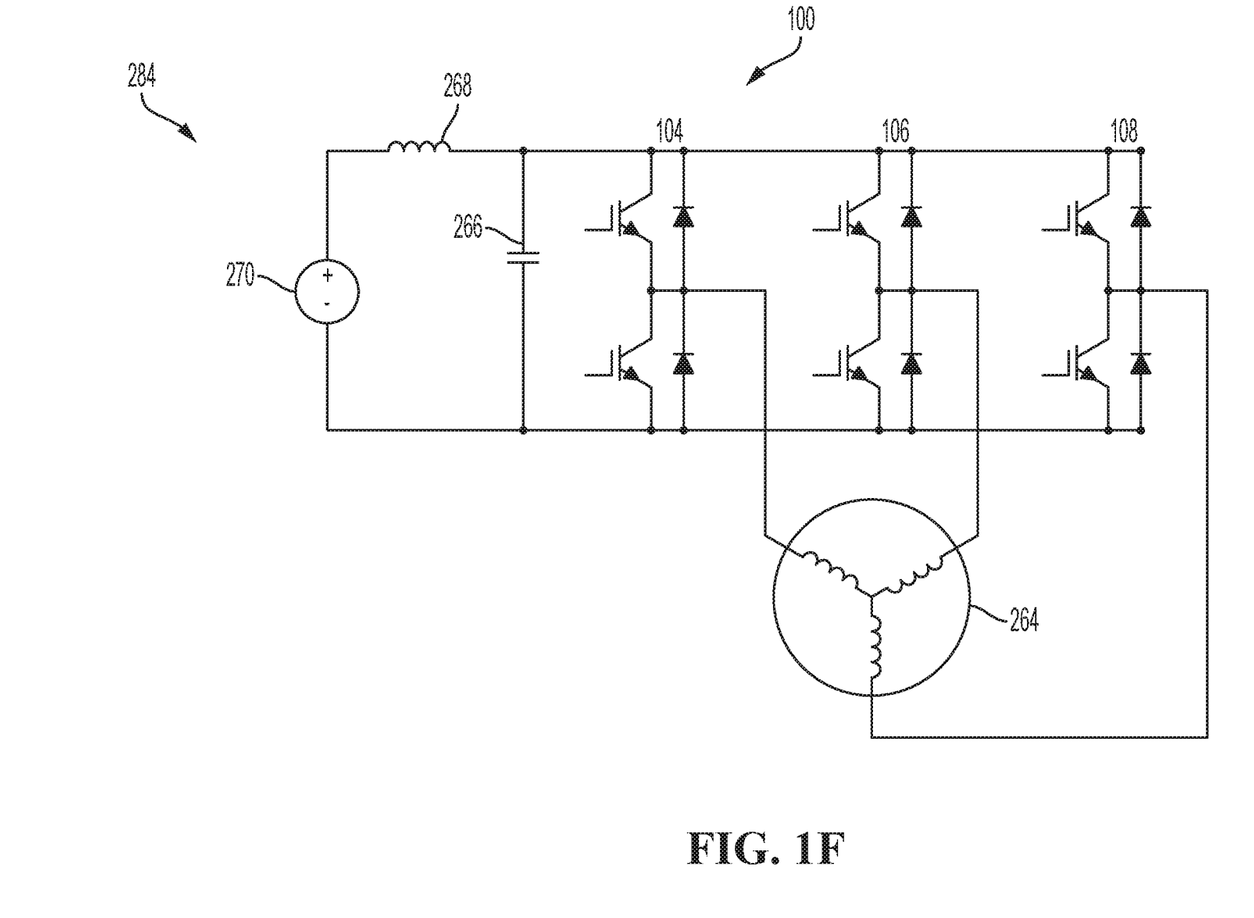
FIG. 1F is a diagram of an example of a three phase inverter of the power electronics assembly according to an embodiment.

FIG. 1E is a cross-sectional view along line 1E-1E of FIGS. 1A and 1B. Single phase cooling portion 152e of the first hybrid cooling assembly 102 and the single phase cooling portion 154f of the second hybrid cooling assembly 110 may cool the second portion 134b of gate drive device 134. In some embodiments, the second portion 134b may a separate module (e.g., control module) rather than a part of the first power electronics module 104.

As illustrated in FIG. 1F, in system 284, each of the first power electronics module 104, the second power electronics module 106, the third power electronics module 108 may be a half bridge of a three phase inverter as shown in FIG. 1F. A three phase motor 264 may be coupled to the first power electronics module 104, the second power electronics module 106 and the third power electronics module 108. A bus link 266, source inductance 268 and battery 270 are also provided. In some embodiments, the capacitors 136, 138, 140 may be passive components of a DC-AC inverter that smooth the DC output of the bus link 266.

Figure 2:
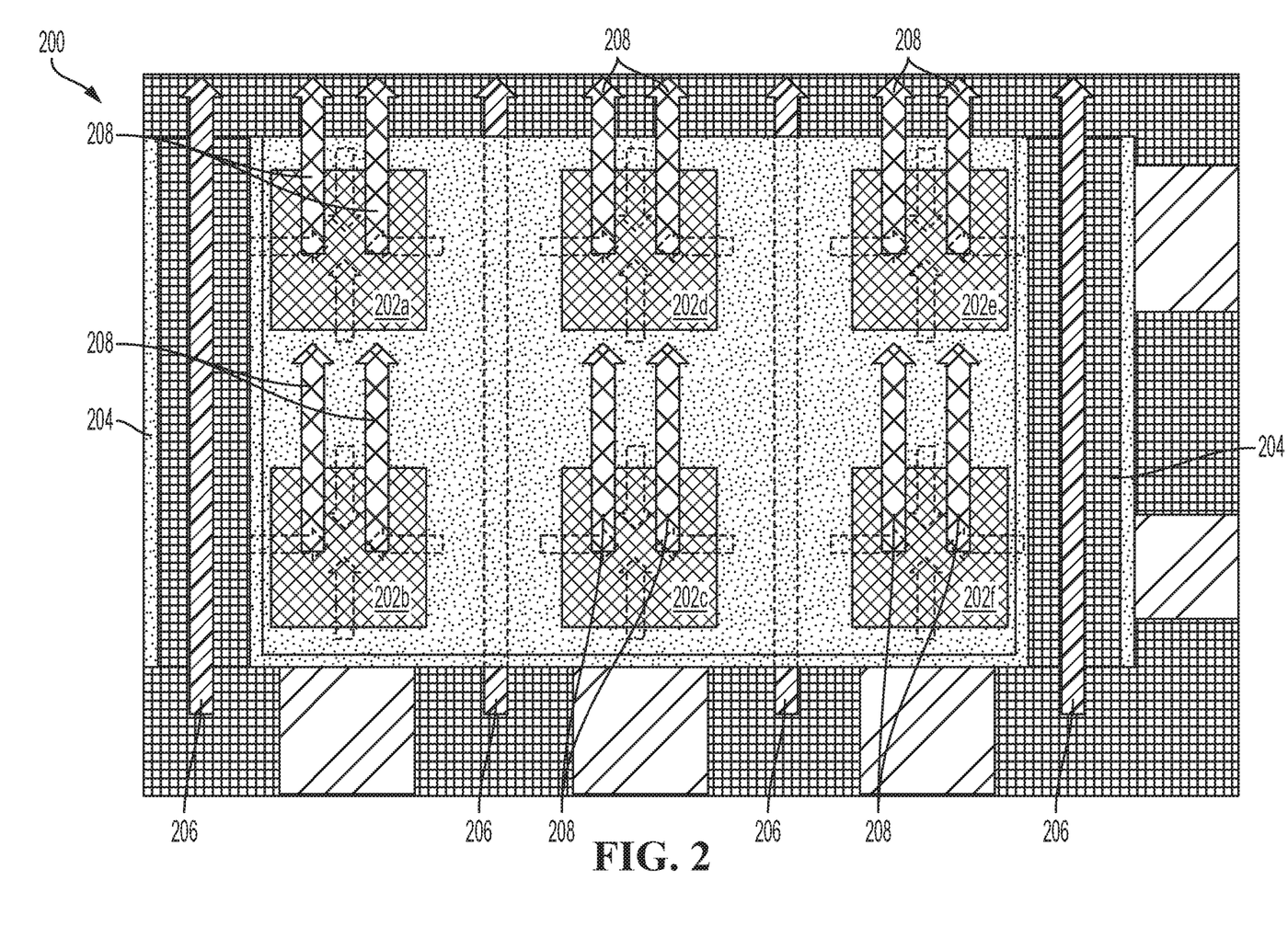
FIG. 2 is a diagram of an example of a top-down view of a hybrid cooling assembly according to an embodiment.

FIG. 2 illustrates a hybrid cooling assembly 200. The hybrid cooling assembly 200 may be readily substituted for any of the first and second hybrid cooling assemblies 102, 110 of FIGS. 1A-1E with some modifications to align two-phase cooling portions with high heat flux components (e.g., transistors) and single-phase cooling portions with low heat flux components (e.g., capacitors and gate drive device). FIG. 2 is a top-down view of the assembly 200.

Coolant 206 may pass through the single-phase cooling portions 204. Each of two-phase cooling portions 202a-202f may include a capillary flow as illustrated by the hatched arrows. The two-phase cooling portions 202a-202f may be a MIO or Porous metal structure. The two-phase cooling portions 202a-202f may generate and output vapor 208.

As illustrated, the single-phase cooling portions 204 may align with capacitors and gate drive devices. The two-phase cooling portions 202a-202f may align with transistors to cool the transistors.

Figure 3:
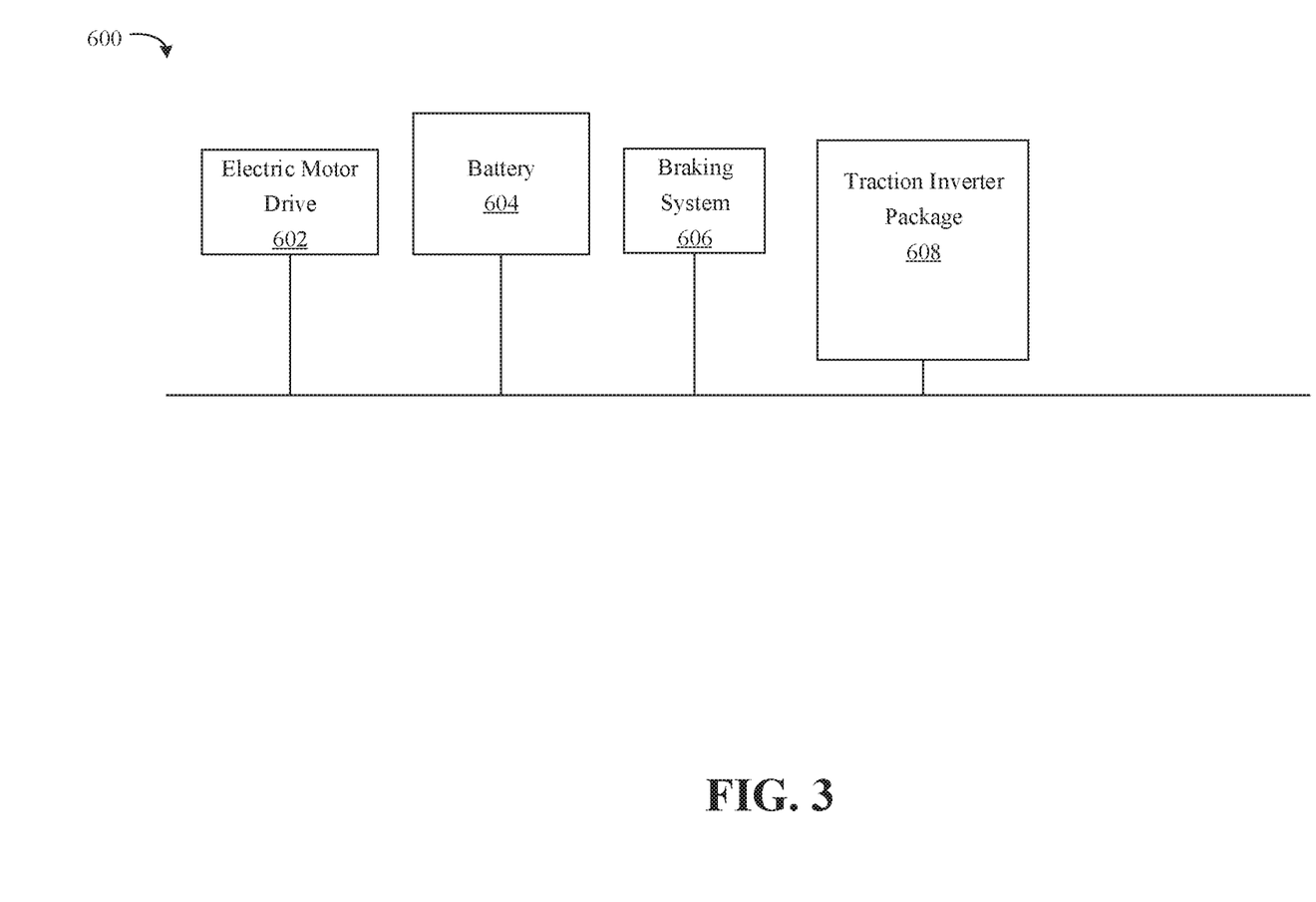
FIG. 3 is a block diagram of an example of a vehicle according to an embodiment.

FIG. 3 illustrates a vehicle 600 that includes a traction inverter package 608. The traction inverter package 608 may be coupled to battery 604 and electric motor drive 602. The traction inverter package 608 may to convert DC current from the battery 604 to AC current. The traction inverter package 608 may provide the AC current to the electric motor drive 602 to drive a propulsion system of the vehicle 600. Moreover, the traction inverter package 608 may capture energy from the braking system 606 and feed the energy back to the battery 604. The aforementioned power electronics assembly 100 may be a part of the traction inverter package 608.

The above described methods and systems may be readily combined together if desired. The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

Those skilled in the art will appreciate from the foregoing description that the broad techniques of the embodiments of the present invention can be implemented in a variety of forms. Therefore, while the embodiments of this invention have been described in connection with particular examples thereof, the true scope of the embodiments of the present disclosure should not be so limited since other modifications will become apparent to the skilled practitioner upon a study of the drawings, specification, and following claims.

We claim:

1. An electronics apparatus comprising:
a plurality of transistors including first transistors and second transistors, the first transistors being disposed opposite the second transistors in a lateral direction with a first space between the first transistors and the second transistors in the lateral direction; and
a gate driver electrically connected to the plurality of transistors to operate the plurality of transistors, the gate driver having a first portion disposed on a straight line connecting at least one of the first transistors and at least one of the second transistors in the first space.

2. The electronics apparatus of claim 1, wherein:
each of the first transistors are disposed on a first lateral side of the electronics apparatus,
each of the second transistors are disposed on a second lateral side of the electronics apparatus opposite the first lateral side, and
the first portion is between the first lateral side and the second lateral side in a central portion of the electronics apparatus.

3. The electronics apparatus of claim 1, wherein in a first view of the electronics apparatus, a second portion of the gate driver is disposed in a second space outside of the first space, wherein a longitudinal axis of the second portion is perpendicular to a longitudinal axis of the first portion.

4. The electronics apparatus of claim 1, wherein each of the first transistors are disposed in a first row and each of the second transistors are disposed in a second row parallel to the first row.

5. The electronics apparatus of claim 4, wherein a longitudinal axis of the first portion is parallel to the first and second rows.

6. The electronics apparatus of claim 1, wherein the gate driver is substantially T-shaped.

7. The electronics apparatus of claim 1, further comprising:
a capacitor electrically connected to at least one of the first transistors and at least one of the second transistors, wherein the capacitor includes a first portion disposed between the first transistors, and a second portion disposed between the second transistors.

8. The electronics apparatus of claim 7, wherein the capacitor includes a third portion connecting the first and second portions of the capacitor, wherein the third portion extends over the first portion of the gate driver.

9. The electronics apparatus of claim 7, further comprising:
   a busbar that electrically connects one or more of the first transistors to one or more of the second transistors, wherein the busbar includes an aperture; and
   an electrical conductor disposed within the aperture and electrically connects the gate driver to one of the first transistors.

10. The electronics apparatus of claim 9, further comprising a cooling device including:
   single-phase cooling portions that cool the capacitor and the gate driver; and
   two-phase cooling portions that cool the first transistors and the second transistors.

11. A vehicle comprising:
   an electric motor drive;
   a battery to supply a current to the electric motor drive; and
   a traction inverter package to modify the current of the battery and provide the modified current to the electric motor drive, the traction inverter package including:
   a plurality of transistors including first transistors and second transistors, the first transistors being disposed opposite the second transistors in a lateral direction with a first space between the first transistors and the second transistors in the lateral direction; and
   a gate driver electrically connected to the plurality of transistors to operate the plurality of transistors, the gate driver having a first portion disposed between on a straight line connecting at least one of the first transistors and at least one of the second transistors in the first space.

12. The vehicle of claim 11, wherein:
   each of the first transistors are disposed on a first lateral side of the traction inverter package,
   each of the second transistors are disposed on a second lateral side of the traction inverter package opposite the first lateral side, and
   the first portion is between the first lateral side and the second lateral side in a central portion of the traction inverter package.

13. The vehicle of claim 11, wherein in a first view of the traction inverter package, a second portion of the gate driver is disposed in a second space outside of the first space, wherein a longitudinal axis of the second portion is perpendicular to a longitudinal axis of the first portion.

14. The vehicle of claim 11, wherein each of the first transistors are disposed in a first row and each of the second transistors are disposed in a second row parallel to the first row.

15. The vehicle of claim 14, wherein a longitudinal axis of the first portion is parallel to the first and second rows.

16. The vehicle of claim 11, wherein the gate driver is substantially T-shaped.

17. The vehicle of claim 11, wherein the traction inverter package further comprises:
   a capacitor electrically connected to at least one of the first transistors and at least one of the second transistors, wherein the capacitor includes a first portion disposed between the first transistors, and a second portion disposed between the second transistors.

18. The vehicle of claim 17, wherein the capacitor includes a third portion connecting the first and second portions of the capacitor, wherein the third portion extends over the first portion of the gate driver.

19. The vehicle of claim 17, wherein the traction inverter package further comprises:
   a busbar that electrically connects one or more of the first transistors to one or more of the second transistors, wherein the busbar includes an aperture; and
   an electrical conductor disposed within the aperture and electrically connects the gate driver to one of the first transistors.

20. The vehicle of claim 19, wherein the traction inverter package further comprises a cooling device including:
   single-phase cooling portions that cool the capacitor and the gate driver; and
   two-phase cooling portions that cool the first transistors and the second transistors.

* * * * *